United States Patent [19]
Fenner et al.

[11] 3,949,247
[45] Apr. 6, 1976

[54] MOUNTING ARRANGEMENT FOR A PIEZOELECTRIC ELEMENT

[75] Inventors: Erich Fenner, Gauting; Max Guntersdorfer, Zorneding, both of Germany

[73] Assignee: Siemens Aktiengesellschaft, Germany

[22] Filed: Apr. 26, 1974

[21] Appl. No.: 464,306

Related U.S. Application Data

[63] Continuation of Ser. No. 336,448, Feb. 28, 1973.

[30] Foreign Application Priority Data

Mar. 10, 1972 Germany............................. 2211751

[52] U.S. Cl. ..................... 310/8.6; 310/8.5; 310/9.1
[51] Int. Cl.² ........................................ H01L 41/04
[58] Field of Search ............... 310/8.2, 8.3, 8.5, 8.6, 310/9.5, 9.6

[56] References Cited
UNITED STATES PATENTS

| | | | |
|---|---|---|---|
| 2,900,536 | 8/1959 | Palo | 310/9.6 |
| 3,110,824 | 11/1963 | Flanagan | 310/8.5 |
| 3,243,614 | 3/1966 | Germano | 310/8.6 |
| 3,500,451 | 3/1970 | Yando | 310/8.5 |
| 3,622,815 | 11/1971 | Schafft | 310/8.6 |
| 3,676,722 | 7/1972 | Schafft | 310/8.6 |

*Primary Examiner*—Mark O. Budd
*Attorney, Agent, or Firm*—Hill, Gross, Simpson, Van Santen, Steadman, Chiara & Simpson

[57] ABSTRACT

An arrangement for mounting one end of a piezoelectric element operating in a bending mode about the one end to generate essentially linear movement for a part of a moving component operatively attached to the other end characterized by a support strip adjacent a side of the element at the point of mounting and extending parallel along the element to modify the stresses applied to the element during a bending operation to prevent damage thereto. The piezoelectric element comprises a carrier strip having at least one side in contact with a ceramic strip or layer and the support strip is disposed adjacent the one end to modify the stresses applied to the ceramic strip to prevent damage thereto. The support strip is provided with a shape and size so that the maximum stress applied to the element occur at a point removed from the point of mounting.

10 Claims, 6 Drawing Figures

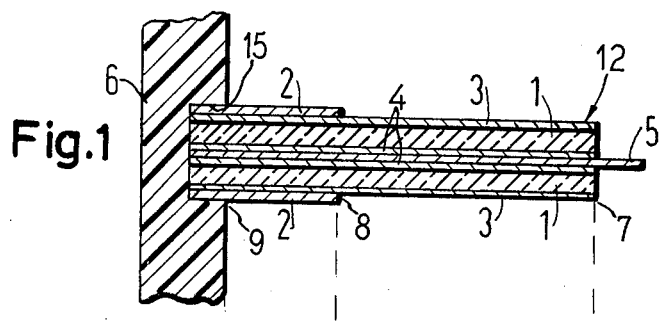
Fig.1
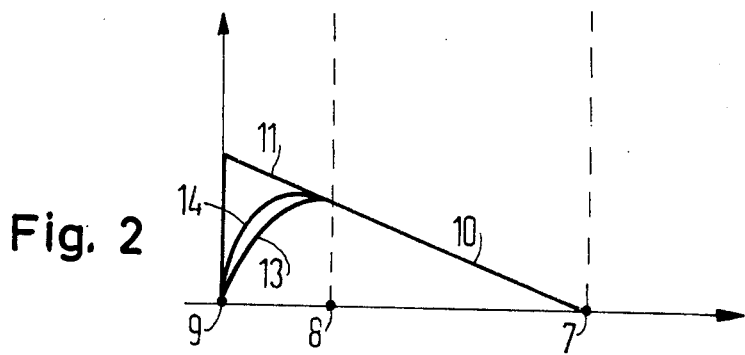
Fig. 2
Fig. 3  Fig. 4  Fig. 5  Fig. 6
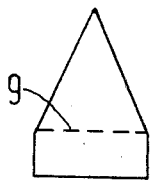 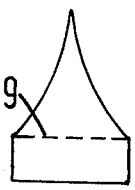 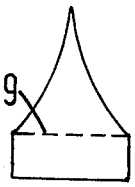 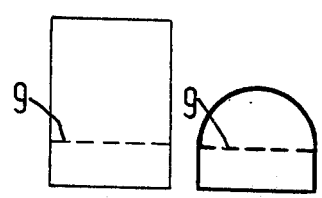

MOUNTING ARRANGEMENT FOR A PIEZOELECTRIC ELEMENT

This is a continuation of application Ser. No. 336,448, filed Feb. 28, 1973.

BACKGROUND OF THE DISCLOSURE

1. Field of the Invention

The present invention relates to a mounting arrangement for fixedly mounting one end of a piezoelectric element which comprises a carrier strip having at least one ceramic strip applied thereto and which element operates in a bending mode about the point of mounting for producing essentially linear movement for a part of a moving component operatively connected to the other end of the element.

2. Prior Art

Piezoelectric elements or piezoelectric benders which operate in a bending mode are well known in prior art. For example, an element having a metal carrier strip disposed between a pair of strips of piezoelectric material, such as lead-zirconium titanate, with electrodes for applying electrical current to the ceramic strip have been suggested. One proposed use of such elements is by rigidly mounting one end of the element in a body and by attaching the other end to a part of a movable component so that during a bending mode, the element creates substantially linear movement of the part attached to the other or free end. Various arrangements have been proposed to form so-called piezoelectric motors which have one or more of the elements arranged in parallel and mounted in the above manner. It has also been suggested to vary either the particular orientation of the ceramic layer or the application of the electrical current so that the element will bend in a substantial S configuration during operation.

While the elements used either alone or in a motor arrangement have proven very useful, they have suffered failure due to the high stress applied to the element adjacent to the rigid mounting point at the one end or in the case of an S bending operation at both ends. In the case of the element which is rigidly mounted at each end and has an S shape bending mode, failure often occurs at either of the fixed or rigid ends.

SUMMARY OF THE INVENTION

The present invention is directed to an arrangement for fixedly or rigidly mounting an end of a piezoelectric element operating in the bending mode which arrangement reduces the chance of damaging the operating element due to high stresses being applied thereto. The arrangement accomplishes this feature by providing a support strip which is disposed between the end of the element and means for engaging the end to fixedly mount the element. The supporting strip has a length extending along the element from a point of engagement by the engaging means to a free end spaced from the point to enable the strip to bear elastically against the element as the element bends towards the support strip during a bending movement. The support strip has sufficient stiffness to yieldingly resist the bending of the element being applied to the ceramic strip of the element below a level which would cause damage to the ceramic strip with the maximum level of stresses being applied to the ceramic strip at a point removed from the point of engagement and the level of stresses applied to the element decreasing from the maximum level as the distance to the point of engagement decreases. Preferably, the support strip is an elastic metal which is prestressed to maintain contact with an electrode disposed on the ceramic strip for applying an electrical current thereto. The supporting strip has a selected dimension and stiffness so that the point of maximum stress applied to the element is adjacent the free end of the support strip. The support strip can be of a constant width or have a decreasing width as the distance from the point of engagement increases and preferably the free end is contoured to have a radius extending away from the surface of the element to prevent damage to the strip by the free end during a bending operation.

BRIEF DESCRIPTION OF THE DRAWINGS

FIG. 1 is a cross section for mounting an element in accordance with the present invention;

FIG. 2 is a graphical presentation of the forces applied to the element with respect to the distance of the element from the point of attachment; and FIGS. 3–6 are plan views of various embodiments of the support strip.

DESCRIPTION OF THE PREFERRED EMBODIMENTS

The principles of the present invention are particularly useful for rigidly or fixedly mounting an end of a piezoelectric element or piezoelectric bender 12, such as illustrated in FIG. 1 which element 12 is an illustrative embodiment of a piezoelectric bender or element. The piezoelectric bender or element 12 comprises a metal strip 5 which is preferably bronze and is disposed between a pair of ceramic layers or strips 1. The outer surface of each of the ceramic strips 1 is provided with an electrode which is illustrated as a metalized layer 3. In addition thereto, the ceramic layer 1 adjacent the bronzed metal strip 5 can be provided with a second metalized layer 4 to provide a second electrode. Each of the electrodes 3 and 4 are connected to a source of electrical current by appropriate terminals which are not illustrated.

As well known in the art, piezoelectric elements or benders utilize a ceramic strip or layer of material such as lead-zirconium titanate which has a property that when an electrical current is applied to the electrodes on the ceramic layer, the layer will bend. This property is due to the permanent orientation of polarization of the ceramic material. Thus, by selecting the direction of polarizaton in the two ceramic layers or strips 1 on opposite sides of the bronze strip 5, and by control of the application of electrical current through the electrodes, the element or bender 12 can be placed in a bending mode of operation to drive a part with substantially linear movement which part is attached or connected to an end of the bronze strip 5 at a free end 7 of the element 12.

The element 12 is mounted at one end by engagement means such as a body 6 which has a groove or recess 15 which engages a portion of the one end at a point of engagement 9, which is adjacent a surface of the body 6, to hold it in a fixed position. Thus, during the bending mode of operation, the element 12 bends around a fixed end or point 9 while the free end 7 moves in the essentially linear path. As illustrated, the strip 5 protrudes passed the free end 7 of the element 12 to provide means for connecting or attachment of a part to be driven by the element.

In the prior art arrangements, a bending stress is applied to the element particularly to the ceramic layer. As illustrated in FIG. 2, the stresses linearly increase from the free end 7 along lines 10 and 11 and approach the maximum value at the point of engagement 9. In the prior art mounting, the portion of the engaged end received in the recess 15 is substantially free of a bending stress so that at point 9, the stresses applied to the element 12 shifts from a maximum to a zero stress. Due to this sudden change in the stress application, the element is often damaged and particularly the ceramic layer is subjected to damage.

The improvement in the mounting arrangement of the present invention is the provision of means to modify the stresses being applied to the element 12 during bending and comprises a support strip 2 for each ceramic strip 1. As illustrated, a support strip 2 is provided on each side of the element 12 adjacent the electrode 3 and is disposed between the one end of the element 12 and the engagement means such as the walls of recess 15 of the body 6. The strips 2 each extend from the point of engagement 9 along the element to a free end 8. During a bending operation of the element, toward the respective strip 2, the strip bears elastically against the element and partially resists the bending of the element as the strip yields to maintain the level of bending stresses applied to the ceramic layer or strip 1 below a level which would cause damage to the ceramic layer. The strip 2 by this yielding and resisting to the movement causes the maximum level of stresses to be applied to the ceramic strip 1 at a point spaced or removed from the point of engagement 9 with the amount of stresses decreasing from the maximum level as the distance from the engagement point 9 decreases. The support strip 2 is dimensioned in both thickness and in shape so that the maximum level of stress applied to the unit and particularly to its respective ceramic layer 1 occurs at a point remote or spaced from the point of engagement 9 and preferably adjacent the free end 8 of the support strip 2. The stresses applied to the component in the area which is contiguous with the strip 2 will follow a curve such as 13 and 14 (FIG. 2) depending on the particular dimensions and thickness and shape of the strip. Thus, as illustrated by curves 13 and 14, the maximum stress level applied to the element during a bending operation is adjacent the free end 8 of the support strip 2.

Preferably, the length of the support strip 2, as measured between the free end 8 and the point of engagement 9 is in a range of 5 to 30 percent of the length of the element 12 as measured from its free end 7 to the point of engagement 9. The stiffness of the support strip 2 which is determined by its structure and thickness is selected to have a stiffness with respect to the piezoelectric element 12 which is in a ratio of a to b, wherein a equals the length of the portion of the support strip 2 which extends from the point of engagement 9 to the free end 8 and b equals the length of the element extending from the point of engagement 9 to its free end 7. The stiffness is intended to signify the quotient of the curvature of the support strip with the bending movement being in the denominator of the quotient.

In accordance with a further embodiment of the invention, the support strip 2 is as long as the length of the zone of the element in which during operational deflection, the curvature of a constant sign is developed. For an element operated in a bending mode and rigidly mounted at one end, as illustrated in FIG. 1, the length of the support strip 2 will be the same as the length of the element having a constant sign of curvature with the length data again related to those parts of the element 12 and the support strip 2 which extend beyond the point of engagement 9. If as previously described, the element is fixed at both ends and is excited during operation so that the strip curvature developes an S shaped profile with an inflection or reversal of the directions of curvature being midway between the fixed ends, then in accordance with the invention, each fixed end is provided with support strips whose length equals the distance between the point of engagement of the respective fixed end and the point of curvature reversal.

The support strip 2 is preferably an elastic metal. As illustrated in FIGS. 3 to 6, the dimensional shape or structure of the strips can take various forms. For example in FIG. 5, a support strip has a rectangular configuration with a constant width from the engagement point 9, which is shown by dash lines.

In other embodiments of the support strip 2, the width of the strip decreases from the engagement point 9 (illustrated in dash lines in FIGS. 3 and 4) to the free ends 8. In FIG. 3, the decrease in width is a linear decrease. In FIG. 4, the decrease in width is in accordance with a parabolic law and the strip has parabolic curved edges. When utilizing a decreased width, as compared with the rectangular strip illustrated in FIG. 5, the transition in the bending stresses loated adjacent the free end 8 (See FIG. 2) do not exhibit any unwanted sudden change or sharp change in direction.

In FIG. 6 the support strip from the point of engagement 9 has a decreasing width resulting in a circular configuration. This kind of support strip as compared with the rectangular shape of the strip illustrated in FIG. 5 has the similar advantages of the embodiments illustrated in FIGS. 3 and 4.

To prevent damage due to the pointed end which is present in the embodiments of FIGS. 3 and 4, the tip of the strip or the free end will be slightly curved or deformed to have a radius extending away from the surface of the element 12 in order to avoid damaging either the electrode layer 3 or the ceramic strip 1 during a bending operation.

In accordance with another embodiment of the invention, the elastic metal support strips 2 which forms the means to modify and are part of mounting means for the piezoelectric elements are prestressed or preloaded in such a manner that during a non-operating condition such as illustrated in FIG. 1, they press against the metalized surface 3 of the ceramic strip 1. It is therefore possible to utilize the support strips 2 in the electrical circuit for applying current to the electrode layers 3. Thus, the terminals can be directly attached to the strips which in turn conducts the current to the layer 3 to be applied on the strips 1. The preloading or prestressing prevents the strips from being pulled away or bent away from the metalized layer 3 during operation and prevent any sparking or arcing during operation of the element 12 and thus reduces or prevents damage to the metalized layer 3 due to arcing or sparking.

In summary, the support strips 2 position the maximum bending stress applied to the element 12 at a point spaced from the point of engagement of the mounting means. With the utilization of the support strips 2, the bending stresses applied to the element 12 increases linearly from the free end 7 to a maximum level and then decreases to substantially zero stresses at the point of engagement 9. With the reduction of the bending stresses caused by support strips 2, the element 12 is free of a sudden change in bending stresses which often caused damage to the element.

Although various minor modifications might be suggested by those versed in the art it should be understood that we wish to embody within the scope of the patent granted hereon all such modifications that reasonably and properly come within the scope of our contribution to the art.

We claim:

1. An arrangement for mounting one end of a piezoelectric element operating in a bending mode for generating essentially linear movement on a part of a moving component operatively attached to the other end of the element, the arrangement having means for engaging a pair of surfaces of the element of the one end at a point of engagement for fixedly mounting the one end of the element so that the element bends about the point during a bending operation, the element comprising a carrier strip having at least one side in contact with a ceramic strip disposed therealong and means including a metallized layer electrode disposed on an outer surface of each of the ceramic strips for applying an electrical current to the ceramic strip to cause bending of the element, the improvement comprising an elastic metal support strip disposed between each of the pair of surfaces of the one end of the element and the engagement means, each metal support strip being prestressed to continually bear against the surface of the element, each support strip having a length extending along the element from the point of engagement to a free end spaced from the point, each support strip having a thickness to partially resist bending of the element thereagainst as the support strip yields to maintain the level of bending stresses applied to the ceramic strip below a level which would cause damage to the ceramic strip with the maximum level of stresses being applied to the ceramic strip at a point removed from the point of engagement and the level of stresses applied to the element decreasing as the distance to the point of engagement decreases.

2. An arrangement according to claim 1, wherein each support strip is selected to have a stiffness in ratio of a to b to the stiffness of the element, wherein a equals the length of the supporting strip which extends beyond the point of engagement and wherein b equals the length of the element which extends beyond the point of engagement.

3. An arrangement according to claim 1, wherein each support strip has a width which decreases as the distance from the point of engagement increases so that the width at the free end is less than the width at the point of engagement.

4. An arrangement according to claim 3, wherein the free end of each support strip is contoured to have a radius extending away from the surface of the element to prevent damage to the element during bending of the element thereagainst.

5. An arrangement according to claim 1, wherein the length of each support strip extending passed the point of engagement is in a range of 5 to 30 percent of the length of the element extending passed the point of engagement.

6. An arrangement according to claim 1, wherein the stiffness and dimensions of the strip are selected so that the maximum bending stress applied to the element occurs adjacent the free end of the support strip.

7. An arrangement according to claim 3, wherein the width of each support strip decreases to result in a circular configuration at the free end of the support strip.

8. An arrangement according to claim 1, wherein each metal support strip has a terminal for connection to the circuit of the means for applying an electrical current to the ceramic layer so that the metal support strip applies the current to the metallized layer electrode.

9. An arrangement for mounting one end of a piezoelectric element operating in a bending mode for generating essentially linear movement on a part of a moving component operatively attached to the other end of the element, the arrangement having means for engaging the one end of the element, the arrangement having means for engaging the one end at a point of engagement for fixedly mounting the one end of the element so that the element bends about the point during a bending operation, the element comprising a pair of ceramic strips with a carrier strip disposed therebetween and in contact therewith, a metallized layer electrode disposed on an outer surface of each of the ceramic strips to form means for applying an electrical current to the ceramic strip to cause bending of the element, the improvement comprising means to modify the stresses being applied to the element during a bending operation and comprising a pair of elastic metal support strips, said strips being disposed on opposite surfaces of the element between the one end and the engagement means, each of the metal support strips being prestressed to continually bear against the metallized layer of the element, each support strip having a length extending along the element from the point of engagement to a free end spaced from the point, each support strip having a thickness to partially resist bending of the element thereagainst as the support strip yields to maintain the level of bending stresses applied to the ceramic strip below a level which would cause damage to the ceramic strip with the maximum level of stresses being applied to the ceramic strip at a point removed from the point of engagement and the level of stresses applied to the element decreasing as the distance to the point of engagement decreases.

10. An arrangement according to claim 8, wherein the width of each support strip decreases with the free end having a semi-circular configuration.

* * * * *